(12) United States Patent
Huang et al.

(10) Patent No.: US 9,153,773 B1
(45) Date of Patent: Oct. 6, 2015

(54) CONTACT FUSE

(75) Inventors: Cheng-Hsiung Huang, Cupertino, CA (US); Shih-Lin Lee, San Jose, CA (US); Shuang Xie, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 338 days.

(21) Appl. No.: 13/214,995

(22) Filed: Aug. 22, 2011

(51) Int. Cl.
*H01L 27/24* (2006.01)
*H01L 45/00* (2006.01)
*H01L 29/78* (2006.01)

(52) U.S. Cl.
CPC ............... *H01L 45/00* (2013.01); *H01L 29/78* (2013.01)

(58) Field of Classification Search
CPC ....... H01L 51/00; H01L 29/08; H01L 29/775; H01L 27/24; H01L 45/00; H01L 45/06; H01L 27/2436; H01L 45/144; H01L 27/112; H01L 29/78; H01L 27/10; H01L 29/785

USPC .......... 257/529, 528, 209, 665; 438/215, 281, 438/333, 467, 601, 131
See application file for complete search history.

(56) References Cited

U.S. PATENT DOCUMENTS

| | | | |
|---|---|---|---|
| 2004/0217441 A1* | 11/2004 | Lehmann et al. | 257/530 |
| 2006/0007612 A1* | 1/2006 | Lusky et al. | 361/56 |
| 2009/0154217 A1* | 6/2009 | Kurjanowicz et al. | 365/96 |
| 2011/0248688 A1* | 10/2011 | Iacob et al. | 323/234 |
| 2012/0028820 A1* | 2/2012 | Rhodes et al. | 506/9 |
| 2012/0044748 A1* | 2/2012 | Chung | 365/148 |

* cited by examiner

*Primary Examiner* — Chuong A Luu
(74) *Attorney, Agent, or Firm* — Womble Carlyle Sandridge & Rice LLP

(57) ABSTRACT

A contact fuse is provided. The contact fuse includes a metal oxide semiconductor (MOS) transistor and a control circuit having outputs coupled to a plurality of terminals of the MOS transistor. The control circuit is operable to forward bias a body-source junction during a programming operation and operable to short the body-source junction during a sensing operation. A method of operating a contact fuse is also provided.

20 Claims, 6 Drawing Sheets

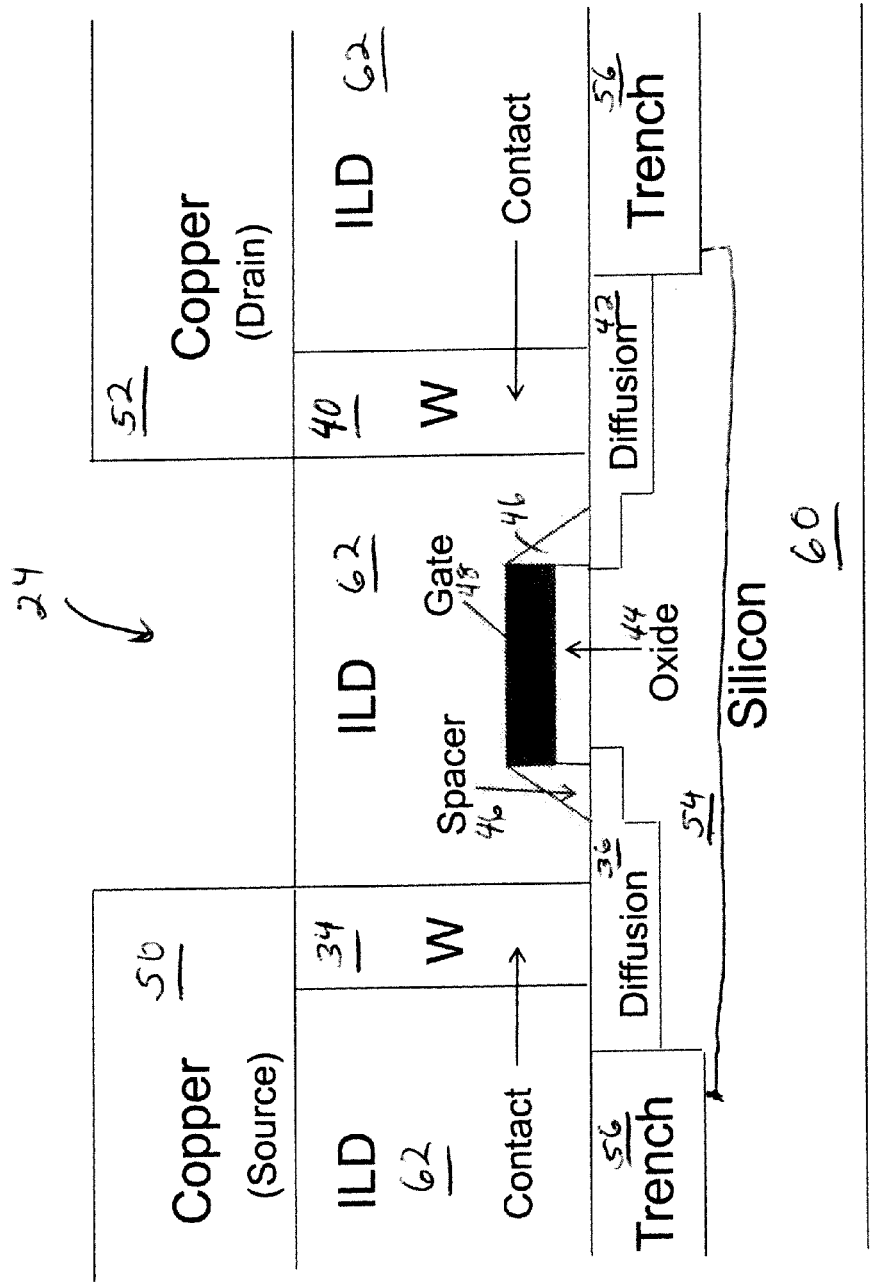

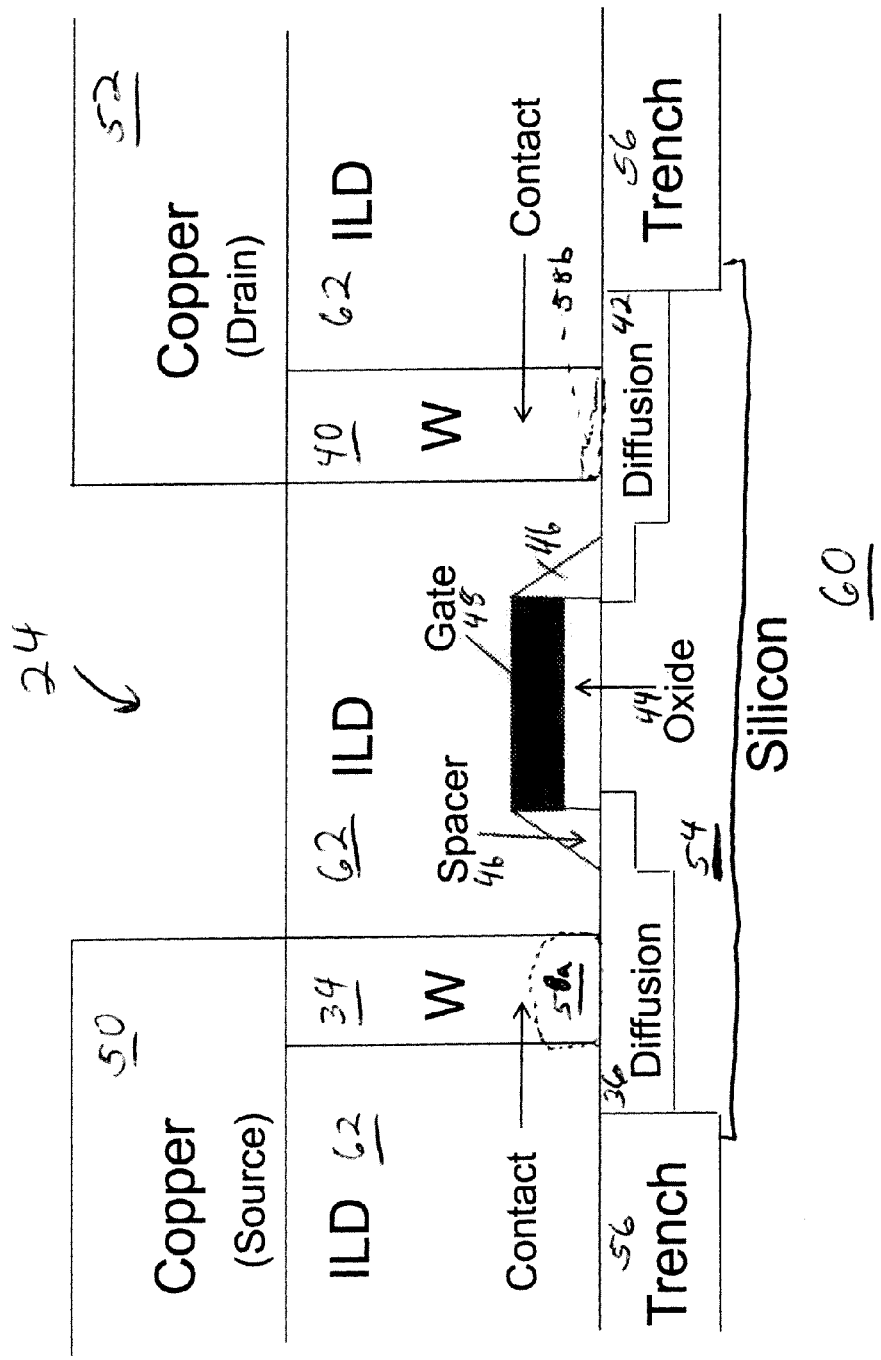

CONTACT FUSE

BACKGROUND

Fuse elements are commonly used in integrated circuits to improve manufacturing yield or customize a circuit. Large numbers of fuses are presently used to implement increasingly sophisticated integrated circuit programming. The implementation of a particular design can require the blowing of thousands of fuses of an integrated circuit. To obtain high numbers of properly programmed devices, the fuses must be blown with an extremely high yield. Continuing refinements in the materials and processes used to fabricate integrated circuits with increasingly smaller and faster transistor components present constant new challenges to fuse designs.

In addition, a large process variation during fabrication operations usually results in either under-programming or over-programming from die to die and from wafer to wafer. Under-programming may be caused by a high resistance of the pre-burn fuse element and/or weak transistor. Over-programming may be caused by a low resistance of the pre-burn fuse element and/or strong transistor. Both of these results are undesirable. Under-programming leads to an incorrect result because a fuse is not completely blown. Over-programming may cause collateral damage, as well as recovery of open fuses, leading to low manufacturing yield and reduced reliability.

It is within this context that the embodiments arise.

SUMMARY

Broadly speaking, the embodiments provide a method of operating a contact fuse and a contact fuse apparatus. It should be appreciated that the embodiments can be implemented in numerous ways, including as a method, a system, or a device. Several exemplary embodiments are described below.

In accordance with one exemplary embodiment, a contact fuse is provided. The contact fuse includes a metal oxide semiconductor (MOS) transistor and a control circuit coupled to a plurality of terminals of the MOS transistor. The control circuit is operable to forward bias a body-source junction of the MOS transistor during a programming operation and the control circuit is operable to short the body-source junction during a sensing operation.

In accordance with another exemplary embodiment, a method of programming a contact fuse is provided. The method initiates with biasing a gate terminal of the contact fuse with a first voltage, where the first voltage has a first value. The method includes biasing a source terminal of the contact fuse with a second voltage, where the second voltage has a negative value. A drain terminal of the contact fuse is also biased with the first voltage.

In accordance with yet another exemplary embodiment, a method of performing a programming operation and a sensing operation for a contact fuse is provided. The method initiates with determining whether a programming or sensing operation is performed. During a programming operation for the contact fuse, a body source junction of the contact fuse is forward biased and a drain terminal of the contact fuse is biased with the voltage having a first value. During the programming operation, a gate terminal of the contact fuse is biased with a voltage having the first value. During a sensing operation for the contact fuse, the body-source junction is shorted and the gate and drain terminals are biased with a voltage having a second value that is less than the first value.

Other aspects and advantages will become apparent from the following detailed description, taken in conjunction with the accompanying drawings, illustrating by way of example the principles of the embodiments.

BRIEF DESCRIPTION OF THE DRAWINGS

The embodiments, together with further advantages thereof, may best be understood by reference to the following description taken in conjunction with the accompanying drawings.

FIGS. 3A and 3B are exemplary schematic diagrams illustrating a cross-sectional view of the contact fuse in accordance with one embodiment.

DETAILED DESCRIPTION

The following embodiments describe a metal oxide semiconductor (MOS) transistor that functions as a contact fuse and a method for operating a contact fuse. It will be obvious, however, to one skilled in the art, that the embodiments may be practiced without some or all of these specific details. In other instances, well known process operations have not been described in detail in order not to unnecessarily obscure the embodiments.

Figure 1:
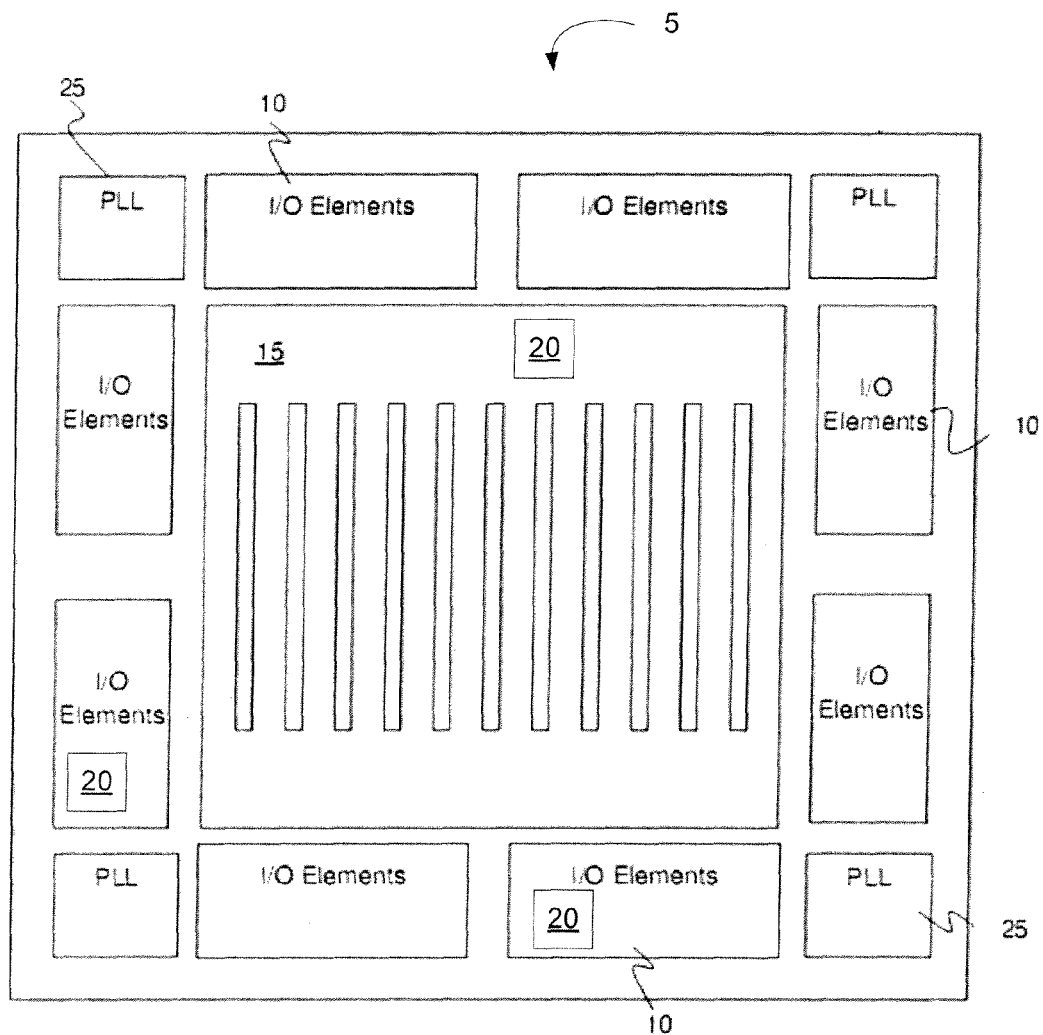
FIG. 1, meant to be illustrative and not limiting, illustrates a simplified block diagram of an integrated circuit (IC) that can include aspects of the present exemplary embodiments.

FIG. 1, meant to be illustrative and not limiting, illustrates a simplified block diagram of an integrated circuit (IC) 5 that can include aspects of the present exemplary embodiments. In one embodiment IC 5 is a programmable logic device (PLD). IC 5 includes core logic region 15 and Input/Output (I/O) elements 10. I/O elements 10 may include a plurality of transceiver channels in one embodiment. Other auxiliary circuits, such as power supplies, and phase-locked loops (PLLs) 25 for clock generation and timing, can be located outside the core logic region 15, e.g., at corners of IC 5 and adjacent to I/O elements 10. Core logic region 15 may be populated with logic cells which include, among other things, at the most basic level, "logic elements" (LEs). LEs may include look-up table-based logic regions and these logic elements may be grouped into "Logic Array Blocks" (LABs). The logic elements and groups of logic elements or LABs can be configured to perform logical functions desired by a user. Core logic region 15 may also include logic circuitry that is coupled together as a block of logic that is configured based on a configuration data in one embodiment. Contact fuse circuit 20 may be incorporated into core logic region 15, I/O elements 10, or any other suitable region of IC 5. As discussed in more detail below, the fuses represented by contact fuse circuit 20, may be one time programmable fuses that are based on a MOS transistor structure and are programmed through a channel current of the MOS transistor.

Figure 2:
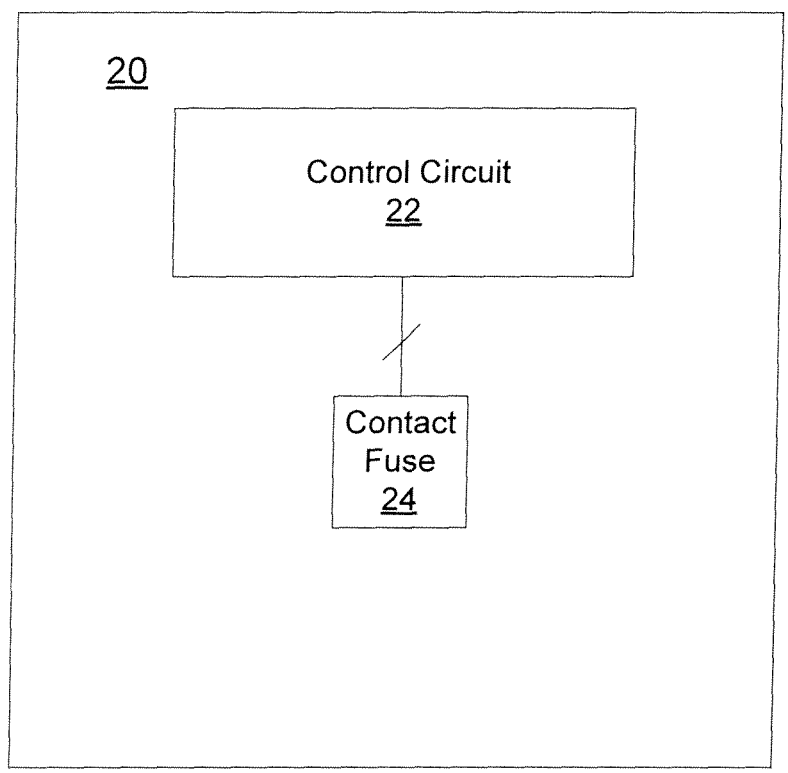
FIG. 2 is an exemplary schematic diagram illustrating further details on the contact fuse circuit in accordance with one embodiment.

FIG. 2 is an exemplary schematic diagram illustrating further details on the contact fuse circuit in accordance with one embodiment. Contact fuse circuit 20 includes a control circuit 22 and contact fuse 24. In one embodiment, contact fuse 24 is a MOS transistor as described in further detail with reference to FIGS. 3A and 3B. It should be appreciated that a number of voltages may be supplied to contact fuse 24 from corresponding outputs of control circuit 22. In one embodiment, control circuit 22 may include an internal power supply, such as a voltage regulator with a charge pump. Alternatively, the power supply may be provided from an external source to control circuit 22. Control circuit 22 may interface with contact fuse 24 through a plurality of traces. The various voltages provided through control circuit 22 are dependent on whether a programming operation or sensing operation is being performed. Where the integrated circuit containing contact fuse circuit 20 is a PLD, logic of the PLD may be configured to provide the corresponding voltages to respective terminals of contact fuse 24.

It should be appreciated that a programming operation when executed, results in "blowing" contact fuse 24, while a sensing operation detects whether contact fuse 24 has been programmed. In one embodiment, the respective programming and sensing voltages are provided in Table 1. According to one embodiment, during a programming operation the voltage at the gate and drain of contact fuse 24 is 2.5 V. The voltage provided at the source of contact fuse 24 is between about −0.5 V to −1 V, while the body of contact fuse 24 is tied to ground. It is, however, appreciated that other embodiments may employ other voltages or voltage ranges for programming and sensing. During a sensing operation the voltage at the gate and drain of contact fuse 24 is 0.9 V, while the source and the body are tied to ground. Further details of the voltage configuration during the programming and sensing operations are provided with reference to FIGS. 4A and 4B.

TABLE 1

|  | Programming | Sensing |
| --- | --- | --- |
| $V_G$ | 2.5 V | 0.9 V |
| $V_D$ | 2.5 V | 0.9 V |
| $V_S$ | −0.5 to −1.0 V | 0 V |
| $V_B$ | 0 V | 0 V |

FIGS. 3A and 3B are exemplary schematic diagrams illustrating a cross-sectional view of the contact fuse in accordance with one embodiment. Contact fuse 24 is defined by gate 48 disposed over oxide 44, which in turn are disposed over well 54. Spacers 46 are disposed along the sides of gate 48 and oxide 44. Source region 36 and drain region 42 are defined through doped regions within well 54. Trenches 56 may be formed to isolate the semiconductor regions of contact fuse 24 from each other at the surface of substrate 60. Interlayer dielectric (ILD) 62 is formed on top of substrate 60 and provides insulation for conductive structures, such as source contact 34 and drain contact 40. It should be appreciated that ILD 62 may be formed from silicon oxide, polymers, or other suitable dielectric materials. Source contact 34 and drain contact 40 are composed of tungsten in one embodiment. In another embodiment, source contact 34 and drain contact 40 are composed of a conductive metal. In addition, gate 48 may be formed from polysilicon in one embodiment, or alternatively, the structure for gate 48 and oxide 44 may be a high K metal gate structure. Metal line 50 and metal line 52 are coupled to source contact 34 and drain contact 40, respectively. In one embodiment, metal lines 50 and 52 are composed of copper, however, this is not meant to be limiting as other conductive metals may be used. FIG. 3A illustrates the structure of contact fuse 24 prior to a programming operation. FIG. 3B illustrates the structure of contact fuse 24 after a programming operation. In FIG. 3B, void 58a appears within source contact 34, while void 58b appears within drain contact 40. Use of the channel current to program contact fuse 24 provides for the depletion of source contact 34 and drain contact 40, as illustrated through void regions 58a and 58b, respectively. As described in more detail below, a channel current, e.g., approximately 10 milliamps (mA) or less, will cause the formation of void regions 58a and 58b within source contact 34 and drain contact 40, respectively.

In one embodiment the high channel current causes the metal from the contacts in the void regions to diffuse from the contact region into the silicon and substrate. In another embodiment, heat from the channel current cracks the barrier between the contact and the substrate and the metal of the contact diffuses into the silicon substrate. Furthermore, the programming voltages are relatively low, in order to achieve the necessary channel current to program the contact fuse. That is, current copper fuses require a current of between about 20-30 mA for the programming operation. While voids are illustrated in both contacts 34 and 40 of FIG. 3B, it is appreciated that a single void, e.g., within source contact 34, is sufficient to program contact fuse 24.

Figure 4A:
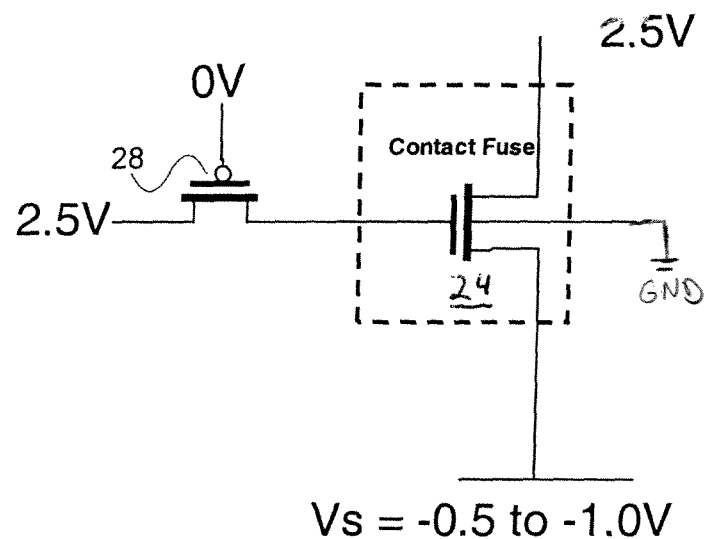
FIGS. 4A and 4B are exemplary schematic diagrams illustrating the programming and sensing voltages applied to the contact fuse in accordance with one embodiment.
Figure 4B:
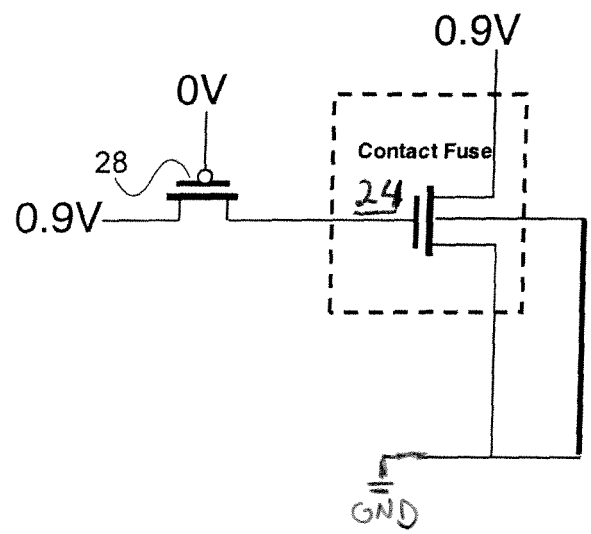

FIGS. 4A and 4B are exemplary schematic diagrams illustrating the programming and sensing voltages applied to the contact fuse in accordance with one embodiment. FIG. 4A, with reference to Table 1, illustrates the programming voltages as applied to contact fuse 24 in one embodiment. P type of metal oxide semiconductor (PMOS) transistor 28 controls the application of voltage to the gate of contact fuse 24. When PMOS transistor 28 is turned on, a voltage of 2.5 V is applied to the gate of contact fuse 24. In one embodiment, the voltage applied to the gate of contact fuse 24 is at least twice the threshold voltage of the contact fuse. Contemporaneously, a voltage of 2.5 V is applied to the drain of contact fuse 24, while the body of contact fuse 24 is tied to ground. In addition, a negative voltage of between about −0.5 V and −1 V is applied to the source of contact fuse 24. Thus, an approximate voltage differential of 3.5 V from the source to the drain is provided in order to program contact fuse 24. In one embodiment, the voltage difference between the gate terminal and the source terminal is at least two times a threshold voltage of the contact fuse. The channel current associated with the 3.5 voltage differential creates conditions for generating at least one void as described above with regard to FIG. 3B. In one embodiment, the programming voltages discussed above are applied as a 10 microsecond pulse. It is appreciated that the body source junction is forward biased during the programming operation illustrated in FIG. 4A. It is further appreciated that the power supplies for the voltages depicted in FIGS. 4A and 4B are available on chip. That is, the −0.5 to −1 volt can be supplied by a back bias generator typically included with most integrated circuits. In addition, a power supply for the 2.5 volts is typically incorporated into commercially available integrated circuits. Thus, the embodiments described herein utilize existing power supplies on commercially available integrated circuits.

In FIG. 4B, with reference to Table 1, the voltages provided for the sensing operation are illustrated. During the sensing operation, PMOS transistor 28 controls the application of voltage to the gate of contact fuse 24. When PMOS transistor 28 is turned on a voltage of 0.9 V is applied to the gate of contact fuse 24. Contemporaneously, a voltage of 0.9 V is applied to the drain of contact fuse 24, while the body of contact fuse 24 and the source are tied to ground, i.e., the body source junction is shorted. It is appreciated that PMOS transistor 28 is not limited to the exemplary PMOS type transistor. For example, an NMOS transistor may be used instead. It is further appreciated that the use of an NMOS transistor for a contact fuse is exemplary and not intended to limit the scope of the present invention. For example, a PMOS transistor may be used to implement the contact fuse 24 where different voltages are applied to its gate, source, drain and body. In addition, PMOS transistor 28 may be included within the control circuitry of FIG. 2 in one embodiment. Alternatively, PMOS transistor 28 may be located external to the control circuitry.

Figure 5:
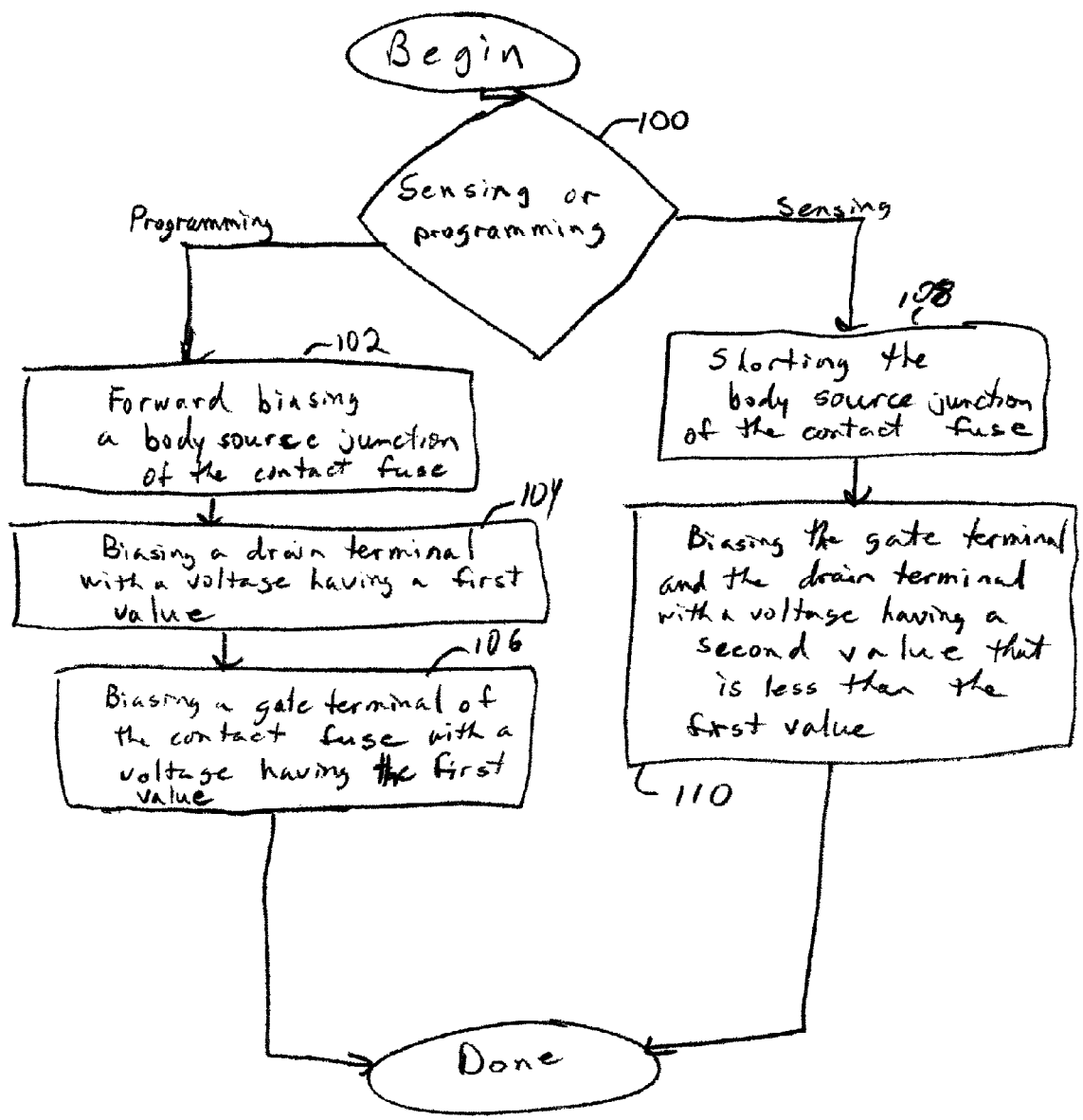
FIG. 5 is an exemplary flow chart diagram illustrating the method operations for operating a contact fuse in accordance with one embodiment.

FIG. 5 is an exemplary flow chart diagram illustrating the method operations for operating a contact fuse in accordance with one embodiment. FIG. 5 initiates with operation 100 where it is determined if a programming operation or a sensing operation is to be executed. Where it is determined that a programming operation is to be executed the method proceeds to operation 102 where a body source junction of the contact fuse is forward biased. As illustrated with reference to FIG. 4A, the forward biasing of the contact fuse is performed while the base of the contact fuse is tied to ground. In contrast to programming currently commercially available contact fuses, where the base of the contact fuse is floating in order to activate a parasitic bipolar device for programming, the MOS transistor described herein utilizes the channel current and eliminates the need to float the contact fuse body. The method then advances to operation 104 where a drain terminal of the contact fuse is biased with the voltage having the first value. In one embodiment, a negative voltage is applied to the source terminal of the contact fuse. The method proceeds to operation 106 where a gate terminal of the contact fuse is biased with the voltage having the first value. In one embodiment, the voltage has a value of 2.5 V. As illustrated with reference to FIGS. 4A and 4B the voltage may be applied to the gate terminal of the contact fuse by turning a transistor on, such as PMOS transistor 28.

If it is determined that a sensing operation is to be performed in operation 100, the method advances to operation 108 where the body-source junction of the contact fuse is shorted. In one embodiment, the body and source are tied to ground, as illustrated with reference to FIG. 4B. The method then proceeds to operation 110 where the gate terminal and the drain terminal are biased with a voltage having a second value that is less than the first value. With reference to FIG. 4B, the voltage for the second value is approximately 0.9 volts in one embodiment. It is appreciated that the resistance ratio (Roff/Ron) detected during the sensing operation for the contact fuse described herein is on the order of 100,000, as opposed to the resistance ratio for a copper fuse that is on the order of 100. Thus, the ability to verify the programming of the contact fuse through the sensing operation is enhanced due to the greater resistance ratio. It should be appreciated that the order of the method operations in the flow chart is not meant to be limiting as the order may change. In another embodiment certain method operations may occur contemporaneously.

The embodiments described above enable the use of a MOS transistor as a contact fuse. The channel current programs the contact fuse by forward biasing a body source junction of the contact fuse. As a MOS transistor is utilized as the contact fuse it should be appreciated that the contact fuse scales readily for each process node as the process nodes decrease. That is, as the MOS transistor becomes smaller for each generation, a lower current is needed to program the fuse. Thus, the contact fuse described herein scales with the technology. In contrast, copper fuses have to be developed for each generation in order to ensure the copper fuses can be formed for each new process node. It should be appreciated that the contact fuses described herein occupy less chip real estate than traditional copper fuses. Furthermore, the smaller programming current for the present embodiments, as compared to copper fuses, enables the simultaneous programming of more fuses.

The method and apparatus described herein may be incorporated into any suitable circuit, including processors and programmable logic devices (PLDs). The PLDs can include programmable array logic (PAL), programmable logic arrays (PLAs), field programmable logic array (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the PLDs owned by the assignee.

The embodiments may be practiced with other computer system configurations including hand-held devices, microprocessor systems, microprocessor-based or programmable consumer electronics, minicomputers, mainframe computers and the like. The embodiments may also be practiced in distributing computing environments where tasks are performed by remote processing devices that are linked through a network.

With the above embodiments in mind, it should be understood that the embodiments may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the embodiments are useful machine operations. The embodiments also relate to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The embodiments can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the foregoing embodiments have been described in some detail for purposes of clarity of understanding, it will be apparent that certain changes and modifications can be practiced within the scope of the appended claims. Accordingly, the embodiments are to be considered as illustrative and not restrictive, and the embodiments are not to be limited to the details given herein, but may be modified within the scope and equivalents of the appended claims.

What is claimed is:

1. A method for programming a contact fuse, the method comprising:
   biasing a gate terminal of the contact fuse with a first voltage, the first voltage having a first value;
   biasing a source terminal of the contact fuse with a second voltage, the second voltage having a negative value relative to a body of the contact fuse; and
   biasing a drain terminal of the contact fuse with the first voltage.

2. The method of claim 1, further comprising:
   biasing a body terminal of the contact fuse to forward bias the body-source junction.

3. The method of claim 1, further comprising:
   biasing a body terminal of the contact fuse to ground.

4. The method of claim 1, further comprising:
   turning on a passgate transistor coupled to the gate terminal of the contact fuse, wherein the passgate transistor is operable to provide the first voltage to the gate terminal of the contact fuse.

5. The method of claim 1, wherein a value of the first voltage is at least two times greater than a value of a threshold voltage of the contact fuse.

6. The method of claim 1, wherein a voltage difference between the gate terminal and the source terminal is at least two times a threshold voltage of the contact fuse.

7. The method of claim 1, further comprising:
   forming a void region in one of a source contact of the source terminal or a drain contact of the drain terminal, wherein the void region is formed by depletion of at least a portion of one of the source contact or the drain contact.

8. The method of claim 1, wherein:
   the contact fuse includes a metal oxide semiconductor (MOS) transistor having the gate terminal, the source terminal and the drain terminal;
   a source of the MOS transistor includes a contact having tungsten therein; and
   a drain of the MOS transistor includes a contact having tungsten therein.

9. The method of claim 1, wherein the programming operation results in metal diffusing from a contact region into silicon at one or more of a source of the contact fuse or a drain of the contact fuse.

10. A method for operating a contact fuse circuit, the method comprising:
    determining whether one of a programming operation or a sensing operation is to be performed;
    during a programming operation for the contact fuse:
      biasing a gate terminal of the contact fuse with a voltage having a first value,
      forward biasing a body-source junction of the contact fuse, and
      biasing a drain terminal of the contact fuse with the voltage having the first value; and
    during a sensing operation for the contact fuse:
      shorting the body-source junction of the contact fuse, and
      biasing the gate terminal and the drain terminal of the contact fuse with a voltage having a second value that is less than the first value.

11. The method of claim 10, further comprising:
    biasing a source terminal of the contact fuse with a negative voltage.

12. The method of claim 10, further comprising:
    turning on a passgate transistor coupled to the gate terminal, wherein the passgate transistor is operable to provide the voltage having the first value to the gate terminal of the contact fuse.

13. The method of claim 10, wherein the programming operation further comprises:
    adjusting the voltage having the first value to generate a current less than 10 milliamps through the contact fuse.

14. The method of claim 10, wherein the programming operation further comprises:
    biasing a body terminal of the contact fuse to ground.

15. The method of claim 10, wherein the sensing operation further comprises:
    coupling a body terminal of the contact fuse and a source terminal of the contact fuse to ground.

16. The method of claim 10, wherein the contact fuse includes a metal oxide semiconductor (MOS) transistor.

17. The method of claim 1, wherein the contact fuse includes tungsten in one of a source contact of the source terminal or a drain contact of the drain terminal.

18. The method of claim 10, wherein the programming operation results in a void at one of a contact of a source of the contact fuse or a contact of a drain of the contact fuse.

19. The method of claim 10, wherein the drain terminal of the contact fuse includes tungsten.

20. The method of claim 10, wherein a source terminal of the contact fuse includes tungsten.

* * * * *